United States Patent
Lee et al.

(10) Patent No.: US 6,235,448 B1
(45) Date of Patent: May 22, 2001

(54) PHOTORESIST MONOMERS, POLYMERS THEREOF, AND PHOTORESIST COMPOSITIONS CONTAINING THE SAME

(75) Inventors: Geun Su Lee; Min Ho Jung; Jae Chang Jung; Cheol Kyu Bok; Ki Ho Baik, all of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/448,911

(22) Filed: Nov. 24, 1999

(30) Foreign Application Priority Data

Nov. 27, 1998 (KR) .................................................. 98-51353

(51) Int. Cl.[7] .................................................... G03C 1/72
(52) U.S. Cl. ...................... 430/270.1; 430/314; 430/323; 522/170; 525/190; 525/523
(58) Field of Search .................................... 522/170, 169; 525/190, 187, 523; 430/270.1, 296, 313, 314, 281.1, 323, 324, 327, 328, 330

(56) References Cited

U.S. PATENT DOCUMENTS 6,048,664 * 4/2000 Houlihan et al. .................. 430/270.1
6,103,449 * 8/2000 Sato .................................. 430/270.1

OTHER PUBLICATIONS

Organic Letters (1999), 1, (9), 1411–1414 American Chemical Socitey On the Stereochemistry of the Dihydropyrone Diels–Alder Reaction; Seth et al. abstract.*

* cited by examiner

Primary Examiner—Hoa Van Le
Assistant Examiner—Yvett M. Clarke
(74) Attorney, Agent, or Firm—Townsend and Townsend and Crew LLP

(57) ABSTRACT

The present invention relates to monomers and polymers prepared therefrom, which are suitable for forming photoresist compositions employed in lithography processes using a deep ultraviolet light source, in particular an ArF light source.

According to the present invention, novel monomers represented by Chemical Formula 1, are provided:

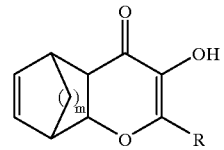

<Chemical Formula 1> wherein R represents a $C_1$–$C_{10}$ alkyl group, and m is the number 1 or 2.

as well as copolymers prepared by using said monomers as represented by Chemical Formula 8:

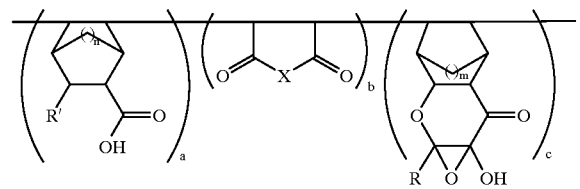

<Chemical Formula 8> wherein R represents a $C_1$–$C_{10}$ alkyl group; R' represents H or —COOH; m is the number 1 or 2; n is a number from 1 to 3; and X represents $CH_2$, NH or O; and a, b and c represent the number of repeating of the respective monomers.

23 Claims, No Drawings

PHOTORESIST MONOMERS, POLYMERS THEREOF, AND PHOTORESIST COMPOSITIONS CONTAINING THE SAME

FIELD OF THE INVENTION

The present invention relates to novel photoresist monomers, polymers formed therefrom and photoresist compositions containing the same. More specifically, it relates to photoresist monomers, polymers and photoresist compositions suitable for photolithography processes employing a DUV (deep ultraviolet) light source, particularly, a ArF light source.

BACKGROUND OF THE INVENTION

Recently, chemical amplification type DUV (deep ultra violet) photoresists have proven to be useful to achieve high sensitivity in processes for preparing micro-circuits in the manufacture of semiconductors. These photoresists are prepared by blending a photoacid generator with polymer matrix macromolecules having acid labile structures.

According to the reaction mechanism of such a photoresist, the photoacid generator generates acid when it is irradiated by the light source, and the main chain or branched chain of the polymer matrix in the exposed portion is reacted with the generated acid to be decomposed or cross-linked, so that the polarity of the polymer is considerably altered. This alteration of polarity results in a solubility difference in the developing solution between the exposed area and the unexposed area. For example, in the case of a positive photoresist, the main or branched chain of the polymer matrix is decomposed by acid in the exposed area and is removed by being dissolved in the developing solution. On the other hand, in the unexposed area, the original structure of the polymer is maintained without being dissolved in the developing solution. As a result, a positive image of a mask is formed on the substrate. In the case of a negative photoresist, the main or branched chain of the polymer matrix is cross-linked, so the exposed area is not dissolved in the developing solution. As a result, a negative image of a mask is formed on the substrate.

As explained above, a chemical amplification type photoresist must comprise a substantial amount of photoacid generator. However, the use of a photoacid generator has several drawbacks: (1) photoacid generators exhibit several problems such as storage stability, gas production, occurrence of "T-topping" of the pattern owing to acid diffusion, high post-baking temperature, and the like; (2) high integration of a semiconductor element is restricted because the E/L (energy latitude) margin of the photoresist pattern must be decreased due to acid diffusion; and (3) the generated acid may combine with amine compounds to contaminate the photoresist composition, thereby deforming the pattern or altering the line width.

Furthermore, since conventional negative photoresist compositions use an organic solvent, such as xylene, as the developing solution, swelling of photoresist film (the phenomenon that developing solution is soaked into the exposed area of the photoresist) occurs during the developing process.

SUMMARY OF THE INVENTION

An object of the present invention is to provide novel photoresist monomers that can form polymers having a photosensitive epoxy group.

Another object of the present invention is to provide photoresist polymers prepared by using the novel monomers described above.

Still another object of the invention is to provide photoresist compositions containing the above polymers, which comprise no photoacid generator or a minimum amount thereof, but respond to extremely short wavelength light with high sensitivity.

In order to achieve these objects, the present invention provides a monomer represented by the following Chemical Formula 1:

<Chemical Formula 1>

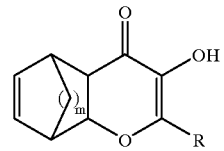

wherein, R represents a $C_1$–$C_{10}$ alkyl group, and m is the number 1 or 2.

In addition, the present invention provides novel photoresist polymers prepared from the compound of Chemical Formula 1. These photoresist have repeating units with a photosensitive epoxy group, as represented by the following Chemical Formula 1a:

<Chemical Formula 1a>

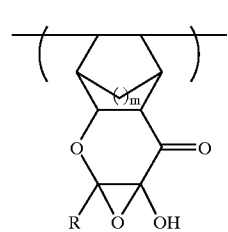

wherein, R and m are as defined for Chemical Formula 1.

Preferred photoresist polymers of the present invention are represented by the following Chemical Formula 8:

<Chemical Formula 8>

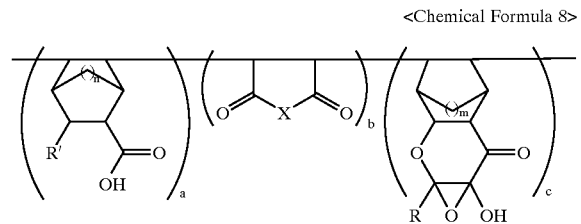

wherein, R represents a $C_1$–$C_{10}$ alkyl group; R' represents H or —COOH; m is the number 1 or 2; n is a number from 1 to 3; X represents $CH_2$, NH or O; and a, b, and c represent the number of repeating units of the respective monomers.

Further, the invention provides a photoresist composition comprising a polymer of Chemical Formula 8, a photoacid generator and a conventional organic solvent.

DETAILED DESCRIPTION OF THE INVENTION

The present invention provides compounds of Chemical Formula 1, which can be used as monomers for forming polymers used in a photoresist composition suitable for use with a light source of extremely short wavelength, and which easily form a cross-linked structure when exposed to light.

<Chemical Formula 1>

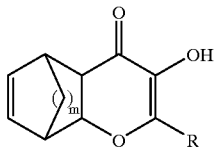

wherein, R represents a $C_1$–$C_{10}$ alkyl group, and m is the number 1 or 2.

Compounds of Chemical Formula 1 can be used for preparing photoresist polymers having repeating units with a photosensitive epoxy group, as represented by the following Chemical Formula 1a:

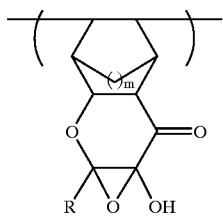

wherein, R and m are as defined for Chemical Formula 1.

The polymers of the present invention are readily cross-linked through their epoxy groups upon irradiation by light of extremely short wavelength, in particular, ArF light (193 nm).

The exposed area, where cross-linking has been formed, is not dissolved in developing solution during the course of the follow-up developing process, and therefore a negative pattern is formed on the substrate.

Since a negative pattern generally has a more significant solubility difference in the developing solution between the exposed area and the unexposed area, as compared to a positive pattern, pattern collapse can be more effectively prevented.

The cross-linking polymers of the present invention may also be used to form a positive pattern through a silylation process in which the —OH group of the polymer reacts with a silylating agent to form a silicone oxide film in the unexposed areas. This film serves as a mask during dry etching of the exposed areas with $O_2$ plasma to obtain a positive pattern.

Synthesis of Novel Monomers

A compound of Chemical Formula 1 is prepared by a Diels-Alder reaction between a cycloalkene compound of Chemical Formula 2 and a compound of Chemical Formula 3 in benzene solvent.

<Chemical Formula 2>

wherein, m is the number 1 or 2.

<Chemical Formula 3>

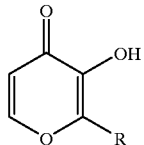

wherein, R represents a $C_1$–$C_{10}$ alkyl group.

Preparation of Novel Polymers

Photoresist copolymers of the present invention are synthesized by copolymerizing a compound of Chemical Formula 1 with other suitable monomers.

Preferable copolymers according to the present invention include the compounds represented by following Chemical Formula 8:

<Chemical Formula 8>

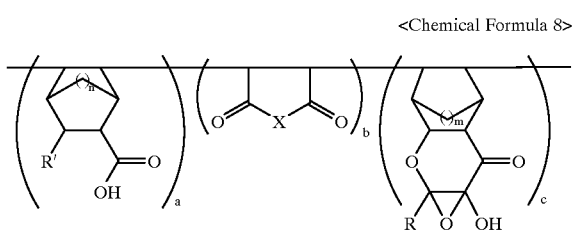

wherein, R represents a $C_1$–$C_{10}$ alkyl group; R' represents H or —COOH; m is the number 1 or 2; n is a number from 1 to 3; X represents $CH_2$, NH or O; and the ratio a:b:c is preferably 1–20 mol %:50 mol %:30–49 mol %.

The molecular weight of the copolymers represented by Chemical Formula 8 is preferably is 4,000 to 10,000.

Preferable copolymers of Chemical Formula 8 comprise the compound of Chemical Formula 9 as a second monomer, which enhances the polymerization of the monomer of Chemical Formula 1. In order to enhance the binding force between the substrate and photoresist, a compound of Chemical Formula 10 may be employed as a third monomer in preferred copolymers of the present invention.

<Chemical Formula 9>

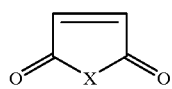

wherein, X represents $CH_2$, NH or O.

<Chemical Formula 10>

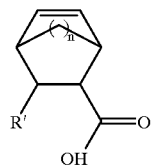

wherein, R' represents H or —COOH; and n is a number from 1 to 3.

In order to prepare the copolymer represented by Chemical Formula 8, the monomers of Chemical Formulas 1, 9 and 10 are dissolved in conventional organic solvent in the presence of a polymerization initiator to obtain the intermediate compound represented by following Chemical Formula 11:

<Chemical Formula 11>

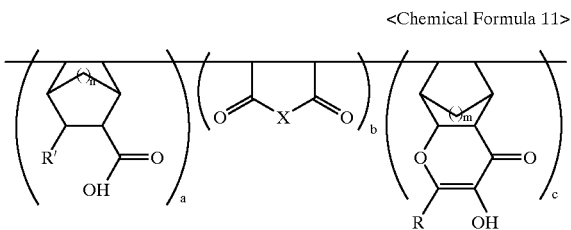

wherein, R, R', m, n, X, a, b and c are as defined for Chemical Formula 8.

As the organic solvent for the polymerization reaction, tetrahydrofuran, dimethyl formamide, dimethyl sulfoxide, dioxane, methyl ethyl ketone, benzene, toluene or xylene may be used. As the polymerization initiator, a conventional radical polymerization initiator such as 2,2'-azobisisobutyronitrile (AIBN), acetyl peroxide, lauryl peroxide, tert-butyl peroxide, or the like may be used.

Then, the compound of Chemical Formula 11 is dissolved in organic solvent, and the resultant solution is reacted with 3-chloroperbenzoic acid to epoxylate the

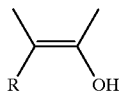

moiety of Chemical Formula 11 to give a compound of Chemical Formula 8.

Preparation of Photoresist Compositions and Formation of Negative Patterns by Using the Same A photoresist composition can be prepared by mixing a photoresist polymer according to the present invention with a conventional organic solvent.

As the organic solvent, ethyl 3-ethoxypropionate, methyl 3-methoxypropionate or cyclohexanone, besides propylene glycol methyl ether acetate, may be used. The amount of the polymer is preferably 1 to 30 wt %, based on the amount of the organic solvent as 100.

Optionally, a small amount of a photoacid generator may also be added. As the photoacid generator, one or more compounds selected from sulfide or onium type photoacid generators, such as diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, or the like, may be used.

The photoacid generator is preferably used in a small amount, for example, 0.05 to 10 wt %, more preferably 0.1 to 5 wt %, on the basis of the weight of the polymer employed.

Photoresist compositions prepared according to the present invention may be spin-coated on a silicon wafer to form a thin photoresist film, which is then "soft-baked" in an oven or on a hot plate at 80 to 150° C., for 1 to 5 minutes, and then exposed to patterned light by using a deep ultraviolet exposer or an excimer laser exposer. As the light source, ArF, KrF, E-beam, EUV, ion beam, or the like may be used.

Then, the photoresist thin film is "post-baked" at 100 to 200° C. As a result, the copolymer in the exposed area becomes insoluble in the developing solution because of cross-linking, while no cross-linking occurs in the unexposed area thereby remaining soluble in the developing solution. Accordingly, when the resultant material is impregnated with 2.38 wt % aqueous TMAH developing solution for 1.5 minutes, the photoresist in the unexposed area is dissolved to give a negative image.

Formation of Positive Photoresist Patterns

A positive photoresist pattern can be prepared by coating a photoresist composition according to the present invention on a conventional substrate, and subsequently performing a conventional silylation process thereon.

As a specific example, a photoresist composition obtained in Example 4 may be spin-coated on a silicon wafer, and soft-baked at 50 to 200° C. for 30 to 200 seconds. Then, the coated wafer is irradiated with 0.1 to 40 mJ/cm$^2$ of light exposure energy by using an ArF laser exposer, and another soft-baking is carried out. Then, a silylation process is performed by using a conventional silylating agent such as HMDS (hexamethyl disilazane), TMDS (tetramethyl disilazane) or DMSDMA (dimethylsilyl dimethylamine), or the like, to provide a silicone oxide film ($SiO_x$) in the unexposed area. Using the film as an etching mask, dry etching using $O_2$ plasma may be carried out to etch the exposed area, and thereby obtain a positive pattern.

Since the photoresist composition according to the present invention may comprise no photoacid generator or a extremely small amount thereof, the present invention solves the problems caused by using large amounts of photoacid generator. Since a pattern is formed by cross-linking, pattern collapse rarely occurs during the developing process, and thus, a pattern of higher integrity can be formed. In addition, since no acid diffusion occurs, a sufficient E/L margin can be maintained to provide a semiconductor element having higher reliability.

Since the photoresists of the present invention are different from conventional negative photoresist compositions, they can be developed in conventional alkaline developing solution, such as 2.38 wt % aqueous TMAH solution, thereby solving the problems associated with using an organic solvent developing solution.

In addition, the type of photoresist can be selected depending upon the properties of the desired pattern, since the photoresists of the present invention can be easily converted from a negative photoresist to a positive photoresist by the silylation process described above.

The monomers according to the present invention and copolymers thereof are particularly useful in a photolithography process employing a short wavelength light source, such as KrF (248 nm), ArF (193 nm), E-beam, ion-beam or EUV.

DETAILED DESCRIPTION OF THE PREFERRED EMBODIMENT

The invention is described in more detail by referring to the examples below, but it should be noted that the present invention is not restricted to these examples:

EXAMPLE 1

Cyclopentadiene, represented by the following Chemical Formula 4 (0.1 mole), and the compound represented by the following Chemical Formula 3a (0.1 mole) were subjected to a Diels-Alder reaction in benzene. After the reaction was completed, benzene was distilled off to obtain the compound represented by the following Chemical Formula 5.

<Chemical Formula 3a>

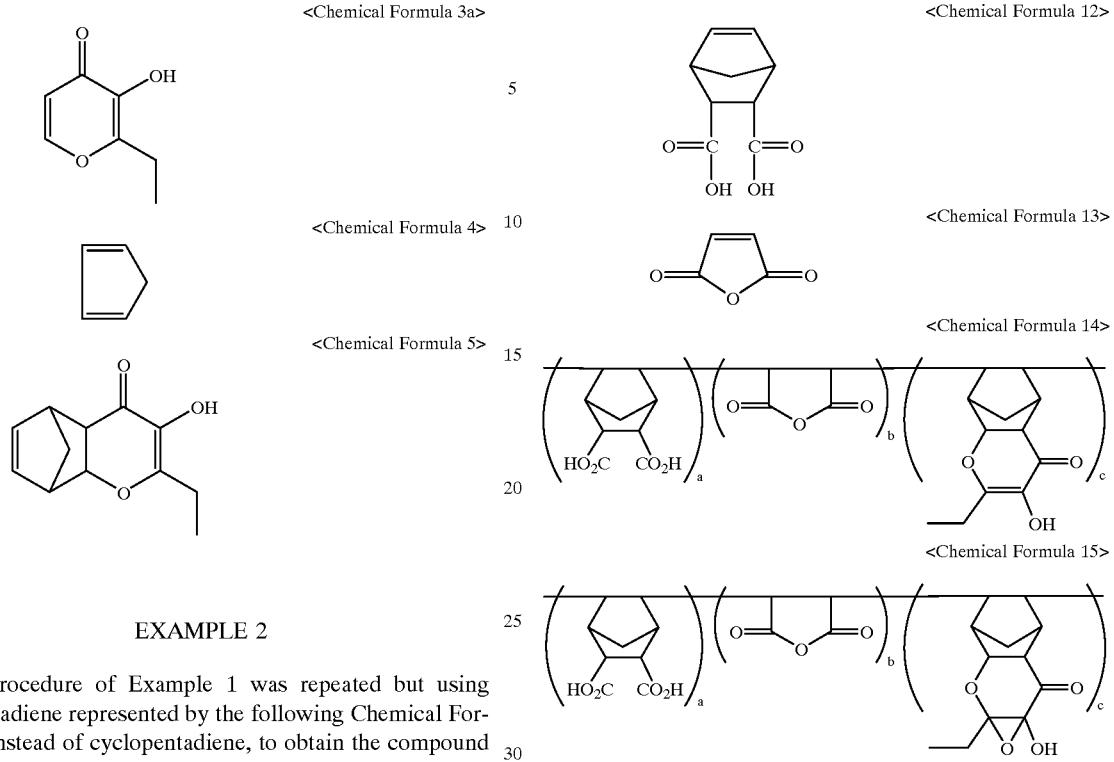

<Chemical Formula 4>

<Chemical Formula 5>

EXAMPLE 2

The procedure of Example 1 was repeated but using cyclohexadiene represented by the following Chemical Formula 6 instead of cyclopentadiene, to obtain the compound of the following Chemical Formula 7 (yield: 99%).

<Chemical Formula 6>

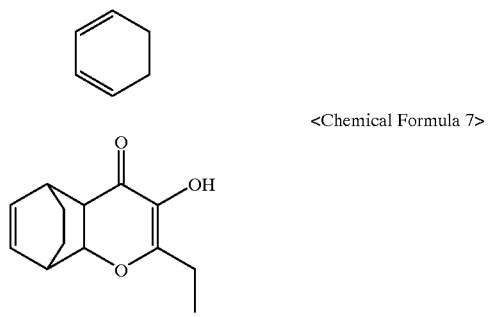

<Chemical Formula 7>

EXAMPLE 3

The compound of Chemical Formula 5 obtained from Example 1 (0.09 mole), the compound represented by the following Chemical Formula 12 and the compound represented by the following Chemical Formula 13 (0.1 mole) were dissolved in tetrahydrofuran solvent, and AIBN (0.3 g) was added thereto. The resultant mixture was reacted at 60 to 70° C. for 12 hours. Tetrahydrofuran was distilled off, and residue was washed with 200 ml of methanol to obtain the compound of the following Chemical Formula 14 as a solid. The compound of Chemical Formula 14 thus obtained was dried, and reacted with 3-chloroperbenzoic acid in tetrahydrofuran at 0–10° C. for 2 hours. After distilling off the tetrahydrofuran, the residue was solidified in ether and filtered. Then, the obtained solid was washed with methanol several times to obtain the copolymer represented by the following Chemical Formula 15 (yield: 32%).

EXAMPLE 4

After dissolving the photoresist copolymer of Chemical Formula 15, obtained from Example 3 (5 g) in ethyl 3-ethoxypropionate (25 g), triphenylsulfonium triflate or dibutylnaphtylsulfonium triflate (0.02 g) was added as a photoacid generator, and the resultant mixture was stirred. Then the mixture was filtered through a 0.10 μm filter to prepare a photoresist solution.

The photoresist solution thus prepared was spin-coated on a silicon wafer, and soft-baked at 110° C. for 90 seconds. Then, after irradiating with light having exposure energy of 0.1 to 40 mJ/cm$^2$ using an ArF laser exposer, the wafer was post-baked again at 110° C. for 90 seconds. When the post-baking was completed, it was developed in 2.38 wt % aqueous TMAH solution for 40 seconds, to obtain 0.14 μm L/S pattern.

What is claimed is:

1. A photoresist polymer having repeating units represented by the following Chemical Formula 1a:

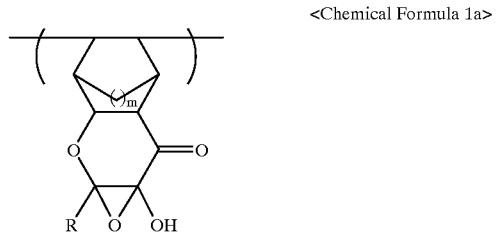

<Chemical Formula 1a> wherein R represents a $C_1$–$C_{10}$ alkyl group, and m is the number 1 or 2.

2. A photoresist polymer according to claim 1 represented by following Chemical Formula 8:

<Chemical Formula 8>

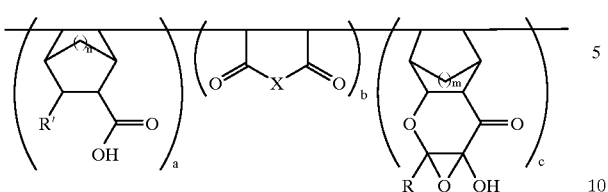

wherein R represents a $C_1$–$C_{10}$ alkyl group; R' represents H or —COOH; m is the number 1 or 2; n is a number from 1 to 3; X represents $CH_2$, NH or O; and a, b and c represent the number of repeating units of the respective monomers.

3. A photoresist polymer according to claim 2, wherein the mol % ratio of a:b:c is 1–20:50:30–49.

4. A photoresist polymer according to claim 2 represented by following Chemical Formula 15:

<Chemical Formula 15>

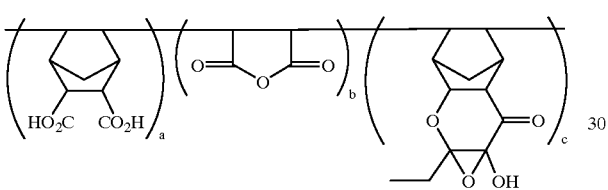

5. A process for preparing a photoresist polymer, which comprises the steps of (a) dissolving a compound of Chemical Formula 1, a compound of Chemical Formula 9, and a compound of Chemical Formula 10 in organic solvent for polymerization:

<Chemical Formula 1>

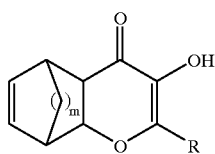

<Chemical Formula 9>

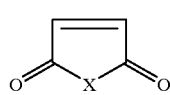

<Chemical Formula 10>

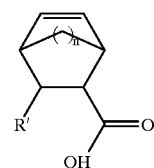

(b) adding a polymerization initiator thereto to carry out polymerization yielding a compound of Chemical Formula 11:

and (c) epoxylating the compound of Chemical Formula 11 to obtain a compound represented by following Chemical Formula 8:

<Chemical Formula 8>

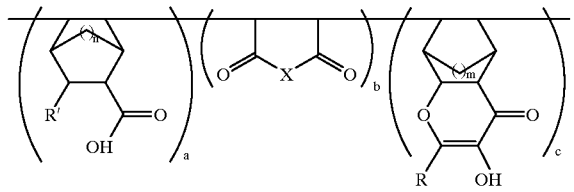

wherein, R represents a $C_1$–$C_{10}$ alkyl group; R' represents H or —COOH; m is the number 1 or 2; n is a number from 1 to 3; X represents $CH_2$, NH or O; and a, b and c represent the number of repeating units of the respective monomers.

6. A process according to claim 5, wherein the organic solvent for polymerization is one or more solvent(s) selected from the group consisting of tetrahydrofuran, dimethylformamide, dimethyl sulfoxide, dioxane, methyl ethyl ketone, benzene, toluene and xylene.

7. A process according to claim 5, wherein the polymerization initiator is one or more compound(s) selected from the group consisting of 2,2-azobisisobutyronitrile, acetyl peroxide, lauryl peroxide and tert-butyl peroxide.

8. A photoresist composition comprising (a) a polymer having repeating units represented by the following Chemical Formula 1a and (b) an organic solvent <Chemical Formula 1a>

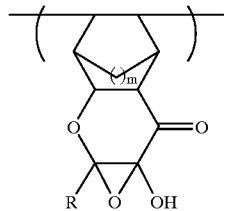

wherein, R represents a $C_1$–$C_{10}$ alkyl group, and m is the number 1 or 2.

9. A photoresist composition according to claim 8, wherein the organic solvent is one or more solvent(s) selected from the group consisting of propylene glycol methyl ether acetate, ethyl 3-ethoxypropionate, methyl 3-methoxypropionate and cyclohexanone.

10. A photoresist composition according to claim 8, wherein the amount of said polymer is 1 to 30 wt % based on the organic solvent.

11. A photoresist composition according to claim 8, which further comprises a photoacid generator.

12. A photoresist composition according to claim 11, wherein the photoacid generator is one or more compound (s) selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate, and dibutylnaphtylsulfonium triflate.

13. A photoresist composition according to claim 11, wherein the amount of the photoacid generator is 0.05 to 10 wt % on the basis of the weight of said polymer.

14. A process for forming a photoresist pattern, which comprises the steps of (a) coating a photoresist composition of claim 8 on a substrate of a semiconductor element to form a photoresist film, (b) exposing the photoresist film to light using light exposure equipment, and (c) developing the photoresist film to obtain a negative pattern.

15. A process according to claim 14, wherein the step (b) is carried out by using a ArF (193 nm), KrF (248 nm), E-beam, EUV (extreme ultraviolet), ion beam or X-lay light source.

16. A process according to claim 14, which further comprises baking step(s) before or after step (b).

17. A process according to claim 16, wherein the baking is performed at a temperature of 50 to 200° C.

18. A process according to claim 14, wherein the developing step (c) is carried out using an aqueous solution of TMAH (tetramethylamine hydroxide).

19. A process for forming a positive pattern, which comprises the steps of (a) coating a photoresist composition of claim 8 on a substrate of a semiconductor element to form a photoresist film, (b) exposing the photoresist film to light using light exposure equipment, (c) silylating the exposed film to form silicon oxide film only in the unexposed area, and (d) etching the silylated film using the silicon oxide film as an etching mask so as to obtain a positive pattern.

20. A process for forming a positive pattern according to claim 19, wherein the silylating step (c) is performed by using one or more silylation agents selected from the group consisting of HMDS (hexamethyl disilazane), TMDS (tetramethyl disilazane) and DMSDMA (dimethylsilyl dimethylamine).

21. A process for forming a positive pattern according to claim 19, wherein the etching step (d) is carried out by using $O_2$ plasma gas.

22. A semiconductor element manufactured by the process according to claim 14.

23. A semiconductor element manufactured by the process according to claim 19.

* * * * *

UNITED STATES PATENT AND TRADEMARK OFFICE
CERTIFICATE OF CORRECTION

PATENT NO. : 6,235,448 B1
DATED : May 22, 2001
INVENTOR(S) : Geun Su Lee; Min Ho Jung; Jae Chang Jung; Cheol Kyu Bok; Ki Ho Baik It is certified that error appears in the above-identified patent and that said Letters Patent is hereby corrected as shown below:

Column 4,
Line 36, reading "Chemical Formula 8 is preferably is 4,000 to 10,000." should read -- Chemical Formula 8 is preferably 4,000 to 10,000. --.

Column 6,
Line 29, reading "invention may comprise no photoacid generator or a" should read -- invention may comprise no photoacid generator or an --.

Column 8,
Line 38, reading "dibutylnaphtyl sulfonium triflate (0.02 g) was added as a" should read -- dibutylnaphtyl sulfonium triflate (0.02 g) was added as a --.

Claim 12,
Line 11, reading "tylnaphtylsulfonium triflate." should read -- tylnaphthylsulfonium triflate --.

Signed and Sealed this

Twelfth Day of March, 2002

*Attest:*

*Attesting Officer*

JAMES E. ROGAN
*Director of the United States Patent and Trademark Office*